United States Patent
Baek

(10) Patent No.: US 6,987,060 B2
(45) Date of Patent: Jan. 17, 2006

(54) SEMICONDUCTOR DEVICE HAVING IMPROVED CONTACT HOLE STRUCTURE AND METHOD FOR FABRICATING THE SAME

(75) Inventor: Seoung-Won Baek, Ichon (KR)

(73) Assignee: DongbuAnam Semiconductor Inc., Seoul (KR)

( * ) Notice: Subject to any disclaimer, the term of this patent is extended or adjusted under 35 U.S.C. 154(b) by 0 days.

(21) Appl. No.: 10/935,026

(22) Filed: Sep. 7, 2004

(65) Prior Publication Data

US 2005/0140017 A1    Jun. 30, 2005

(30) Foreign Application Priority Data

Dec. 27, 2003  (KR)  .................. 10-2003-0098379

(51) Int. Cl.
*H01L 21/4763* (2006.01)
(52) U.S. Cl. ................. 438/629; 438/632; 438/636
(58) Field of Classification Search ........ 438/629–640, 438/667–669, 672, 675; 257/774
See application file for complete search history.

(56) References Cited

U.S. PATENT DOCUMENTS 6,211,051 B1 *   4/2001  Jurgensen et al. .......... 438/669
6,214,524 B1     4/2001  Mohondro
6,664,031 B2    12/2003  Jung et al.
6,720,256 B1 *   4/2004  Wu et al. ................... 438/638
6,759,350 B2 *   7/2004  Tsai ........................... 438/637

FOREIGN PATENT DOCUMENTS

KR    10-2003-0070653    9/2003

OTHER PUBLICATIONS

Korean Patent Abstracts; Method for Forming Contact Hole of Semiconductor Device; Publication No. 1020030070653 A; Publication Date Sep. 2, 2003.

* cited by examiner

*Primary Examiner*—Cuong Nguyen
(74) *Attorney, Agent, or Firm*—Andrew D. Fortney

(57) ABSTRACT

A contact hole fabrication method for semiconductor device includes forming a dielectric layer on a semiconductor substrate, forming an antireflective layer on the dielectric layer, forming an amine source layer on the antireflective layer, forming a photoresist layer on the amine source layer, forming a first hole pattern having a T profile and a footing profile by exposing and developing the photoresist layer, forming a second hole pattern in which the profiles are changed by reflowing the photoresist layer, and forming a contact hole by selectively removing the amine source layer, the antireflective layer, and the dielectric layer using the photoresist layer as a mask.

15 Claims, 2 Drawing Sheets

SEMICONDUCTOR DEVICE HAVING IMPROVED CONTACT HOLE STRUCTURE AND METHOD FOR FABRICATING THE SAME

BACKGROUND OF THE INVENTION (a) Field of the Invention

The present invention relates to a semiconductor device and, in particular, to a semiconductor device having a fine (small or narrow diameter) contact hole and a method for fabricating the fine contact hole.

(b) Description of the Related Art

As computers are widely spread for personal use, the semiconductor devices in computers are required to operate at high speed and to have high storage capability. In order to satisfy these requirements, semiconductor device fabrication technology has been developed so as to improve the device integration and density (e.g., reduce structure dimensions), operation reliability, and response time. To improve the device integration and/or density, it is required to form fine contact holes in various dielectric layers in the device.

The contact hole is formed such that a contact or via fills the contact hole with a conductive material for making an electrical connection between an electrode (e.g., a transistor terminal) and a wiring layer or between upper and lower (e.g., adjacent) wiring layers. In order to form a fine contact hole, it has been proposed to use a light source having relatively short wavelength, such as light from a KrF source, which recently has been used to form the contact hole during a lithography process for fabricating semiconductor devices using 0.13 $\mu$m or narrower linewidth technology.

The typical contact hole fabrication using photolithography is carried out in a sequential order of forming a dielectric layer on a semiconductor substrate, forming an anti-reflective coating ("ARC") on the dielectric layer, forming a photoresist layer on the anti-reflective coating, and then forming a hole pattern on the photoresist layer through the photolithography process (e.g., selective irradiation of portions of the photoresist corresponding to the pattern with light, and development of the irradiated photoresist with one or more solvents).

However, it is difficult to form the hole pattern defining the contact hole in a width narrower than that of the design rule of a reticle used for photolithography. Accordingly, where the dielectric layer is selectively etched using the photoresist layer as a mask, there has been a limit to the minimum diameter of a fine contact hole fabricated using a conventional photolithography process.

U.S. Pat. Nos. 6,214,524 and 6,664,031 disclose contact hole fabrication methods using amine processes. However, these contact hole fabrication methods may also have limitations in forming a fine contact hole having a width narrower than that of the design rule of the reticle, as in the typical contact hole fabrication technique.

SUMMARY OF THE INVENTION

The present invention has been made in an effort to solve the above problems, and an object of the present invention is to provide a method for fabricating an improved contact hole (e.g., one that may have a width or diameter narrower than a corresponding reticle design rule) and a semiconductor device having the improved contact hole.

In order to achieve the above object, in one aspect of the present invention a method for fabricating a contact hole includes forming an amine source layer on an antireflective layer-dielectric layer structure on a semiconductor substrate, forming a photoresist layer on the amine source layer, forming a first hole pattern having a T profile and a footing profile by exposing and developing the photoresist layer, forming a second hole pattern at which the profiles are removed by reflowing the photoresist layer; and forming a contact hole by selectively removing the amine source layer, the antireflective layer, and the dielectric layer using the photoresist layer on which the second hole pattern is formed as a mask. In further embodiments, the method further includes forming the dielectric layer on the semiconductor substrate and/or forming the antireflective layer on the dielectric layer.

Here, the amine source layer may comprise hexamethyldisilane and/or hexamethyldisilazane (HMDS).

The T profile of the first hole pattern has a shape protruding at an upper part of a sidewall of the hole pattern and the footing profile has a shape protruding at a lower part of the sidewall of the hole pattern. The T profile and the footing profile are believed to be formed as a result of the amine reacting with photo-generated acid ($H^+$) in a photoresist layer area in contact with the amine source layer, subsequently inhibiting or preventing removal of such amine-reacted photoresist layer area(s), while the exposed area of the photoresist layer is removed by the developer solution when the acid ($H^+$) generated during the exposure of the photoresist layer does not react with the amine. Accordingly, the T profile and the footing profile are changed during the reflow process, such that it is possible to form a second hole pattern having a linewidth narrower than that of the design rule of the corresponding reticle used to form the hole pattern.

In another aspect of the present invention, the semiconductor device includes a semiconductor substrate having a dielectric layer, an antireflective layer formed on the dielectric layer, an amine source layer formed on the antireflective layer, and a contact hole formed on the amine source layer, the antireflective layer, and the dielectric layer.

DETAILED DESCRIPTION OF THE PREFERRED EMBODIMENTS

A preferred embodiment of the present invention will be described hereinafter with reference to the accompanying drawings.

Figure 1A:
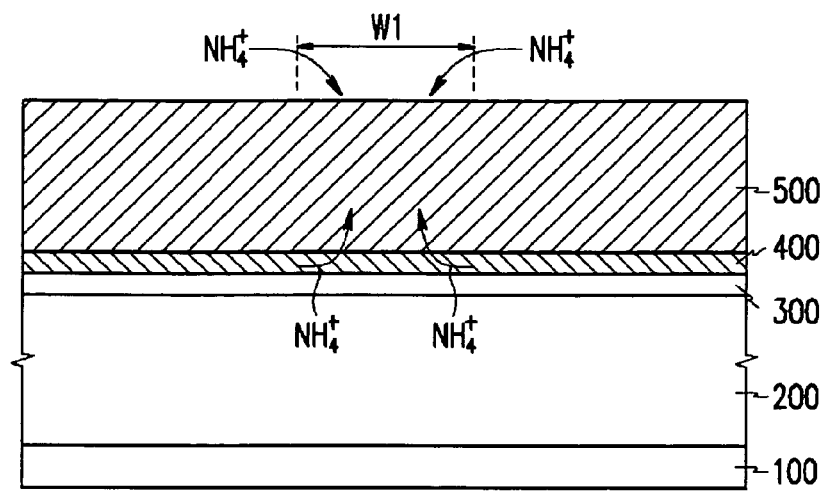
FIG. 1A to FIG. 1D are schematic cross-sectional views of a semiconductor device for illustrating a method for fabricating a contact hole according to a preferred embodiment of the present invention.
Figure 1B:
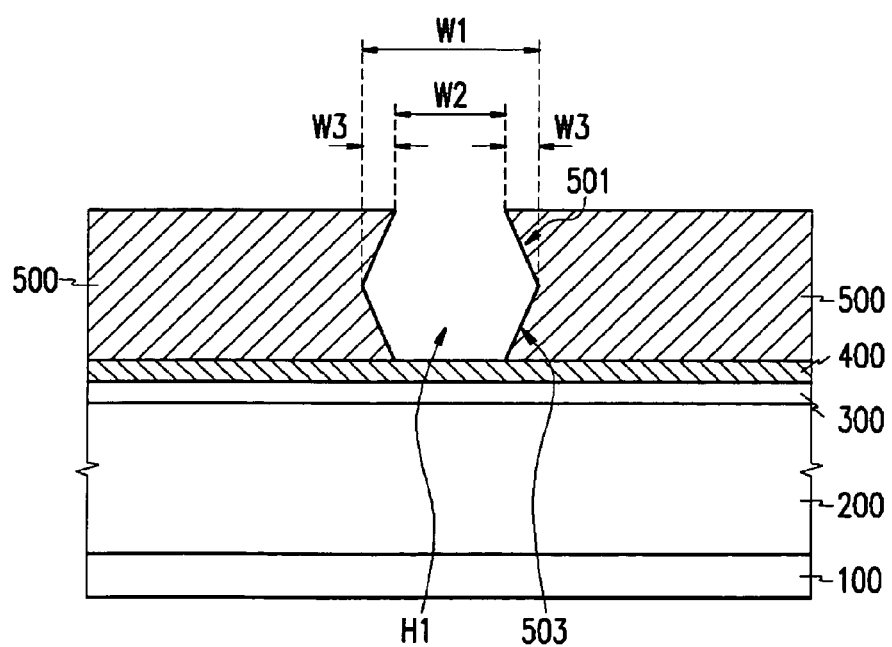
Figure 1C:
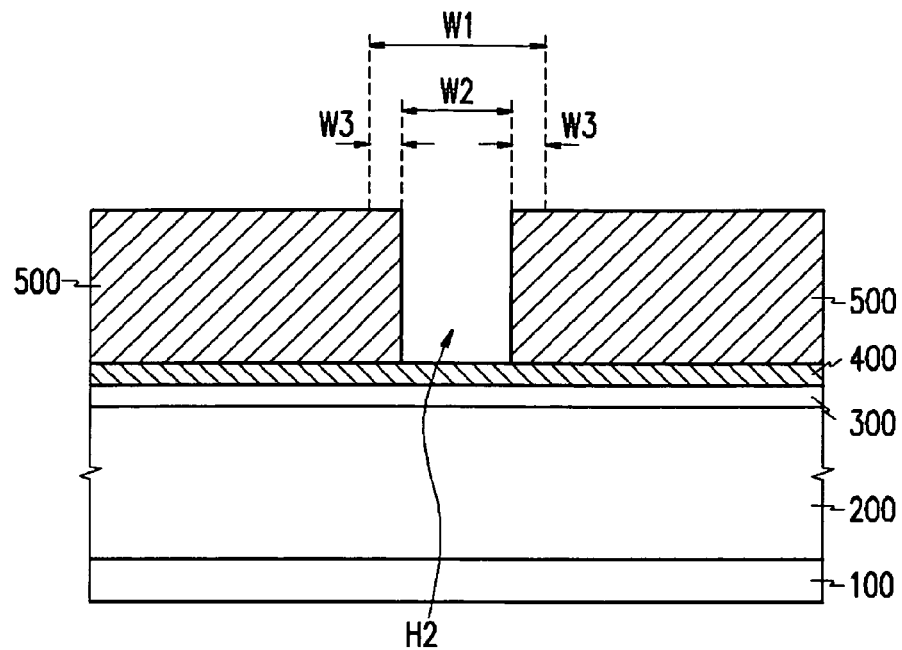
Figure 1D:
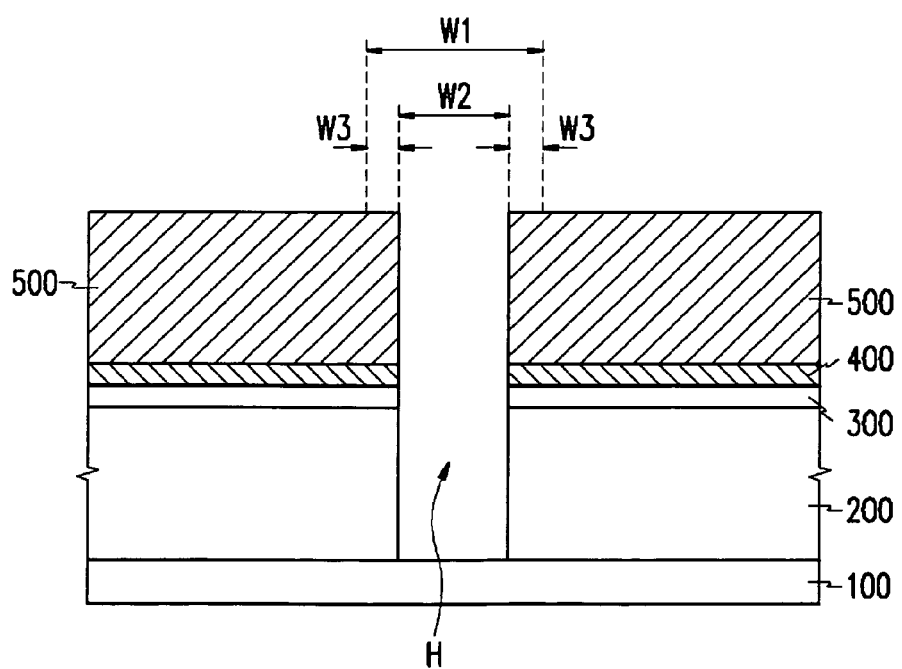

FIG. 1A to FIG. 1D are schematic cross-sectional views of a semiconductor device illustrating the method for fabricating a contact hole according to a preferred embodiment of the present invention. As shown in drawings, firstly a dielectric layer 200 is formed on a semiconductor substrate 100. The dielectric layer may comprise an interlayer dielectric (ILD) material such as borosilicate glass (BSG), phosphosilicate glass (PSG), borophosphosilicate glass (BPSG), fluorosilicate glass (FSG), undoped silicate glass (USG), a tetraethylorthosilicate (TEOS)-based glass, or a combination thereof. Not shown in drawings, base structures including a wiring layer are formed between the dielectric layer 200 and the semiconductor substrate 100 (hence, the term "interlayer" dielectric, as opposed to "intermetal" dielectric).

Next, an anti reflective layer 200 is formed on the dielectric layer, and then the amine source layer 400 is formed on the antireflective layer 300 which provides the amine to the photoresist layer 500 during the following exposure process. Here, the amine source layer 400 may comprise a silyl amine (such as hexamethyldisilazane [HMDS]) and/or hexamethyldisilane; a cyclic amine, such as N-methylpyrrolidine, N-methylpyrroline, N-methylpyrrole, pyridine and/or morpholine; or ammonia and/or an ammonium hydroxide (e.g., $NH_4^+$ $OH^-$, or $R_4N^+$ $OH^-$, where R is an alkyl group such as methyl or ethyl).

Sequentially, a photoresist layer 500 is formed on the amine source layer 400, and then the photoresist layer 500 is patterned at a width (W1) of the design rule of the contact hole reticle through the photolithography process. While exposing the photoresist layer 500, an acid ($H^+$) is generated or emitted in the exposed area of the photoresist layer 500 (e.g., from a photoacid generator [PAG] such as triphenylsulfonium trifluoromethyl-sulfonate, bis-(4-t-butylphenyl) iodonium p-toluenesulfonate, etc.). Where the acid reacts with the amine, the photoresist layer 500 generally is not removed by the developer solution. However, the acid ($H^+$) generated during the exposure process reacts with an amine provided from outside (e.g., on the surface of the photoresist layer) as well as the amine from the amine source layer 400. Thus, the present method may further comprise forming a second amine source layer on the photoresist layer 500, either before or after exposure. Alternatively, the irradiating step during photolithography (exposure) may be performed in an atmosphere containing an amine, such as a silyl amine (e.g., hexamethyldisilazane[HMDS]) a cyclic amine (e.g., N-methylpyrrolidine [NMP]), or ammonia gas. The amine source in the second amine source layer may be any of those described above for amine source layer 400 Thereafter, the exposed area of the photoresist layer 500 is removed by the developer solution so as to form a first hole pattern (H1) which is provided with a T profile 501 and footing profile 503 at an upper and lower parts of the sidewall.

Next, a reflow process is performed by heating the photoresist layer 500 such that the T profile 501 and footing profile 503 flow to obtain a vertical or almost vertical second hole pattern (H2), the width of which may become narrower, as much as a predetermined width (2×W3, where W3 is the protrusion width of the T profile 501 and/or the footing profile 503, or an average protrusion width of the T profile 501 and the footing profile 503) relative to the pattern width (W1) of the exposed area. Thus, the reflowing step of the present invention may comprise heating the photoresist layer until the contact hole has a substantially vertical sidewall. In this case, the center region of the photoresist layer 500 (i.e., that portion of photoresist layer 500 where the T profile 501 and the footing profile 503 are relatively small) is believed to flow at a faster rate than the outer regions of the photoresist layer 500 (i.e., those portions where the T profile 501 and the footing profile 503 protrude to a relatively greater extent) due to a greater amount of solvent in the center region of the photoresist layer 500 and/or due to surface effects at the upper and/or lower surfaces of the photoresist layer 500 (perhaps related to a so-called "bowing effect"). Consequently, using the photoresist layer having the second hole pattern (H2), the amine source layer 400, antireflective layer 300, and dielectric layer 200 are etched so as to form the contact hole.

As described above, in the present invention a fine contact hole is formed with a diameter narrower than that of the design rule of the corresponding reticle used to pattern the contact hole. Accordingly, it is possible to manufacture a highly integrated semiconductor device having surprisingly narrow contact holes.

What is claimed is:

1. A method for fabricating a contact hole comprising:
   a) forming an amine source layer on an antireflective layer, the antireflective layer being on a dielectric layer on a semiconductor substrate;
   b) forming a photoresist layer on the amine source layer;
   c) forming a first hole pattern having a T profile and a footing profile by exposing and developing the photoresist layer;
   d) forming a second hole pattern at which the profiles are changed by reflowing the photoresist layer; and
   e) forming a contact hole by selectively removing the amine source layer, the antireflective layer, and the dielectric layer using the photoresist layer as a mask.

2. The method of claim 1, wherein the amine source layer comprises HMDS.

3. The method of claim 1, wherein the reflowing comprises heating the photoresist layer.

4. The method of claim 1, further comprising forming said antireflective layer on the dielectric layer.

5. The method of claim 4, further comprising forming said dielectric layer on said semiconductor substrate.

6. A method for fabricating a contact hole, comprising:
   a) forming an amine source layer on an antireflective layer, said antireflective layer being on a dielectric layer on a semiconductor substrate;
   b) forming a photoresist layer on the amine source layer;
   c) forming a hole pattern in the photoresist layer;
   d) reflowing the photoresist layer; and
   e) selectively removing the amine source layer, the antireflective layer, and the dielectric layer using the photoresist layer as a mask to form said contact hole.

7. The method of claim 6, wherein the amine source layer comprises a silyl amine, a cyclic amine, ammonia, or an ammonium salt.

8. The method of claim 7, wherein the amine source layer comprises hexamethyldisilazane.

9. The method of claim 7, wherein the amine source layer comprises N-methylpyrrolidine, N-methylpyrroline, N-methylpyrrole, pyridine and/or morpholine.

10. The method of claim 7, wherein the amine source layer comprises an ammonium hydroxide.

11. The method of claim 6, wherein the reflowing comprises heating the photoresist layer until the contact hole has a substantially vertical sidewall.

12. The method of claim 6, further comprising forming said antireflective layer on the dielectric layer.

13. The method of claim 12, further comprising forming said dielectric layer on said semiconductor substrate.

14. The method of claim 6, wherein the contact hole has a width of 0.13 µm or less.

15. The method of claim 6, wherein the contact hole has a width less than a corresponding reticle design rule.

* * * * *